United States Patent [19]
Feldbaumer et al.

[11] Patent Number: 5,586,046
[45] Date of Patent: Dec. 17, 1996

[54] COMPUTER IMPLEMENTED METHOD FOR GENERATING AN INTEGRATED CIRCUIT DESIGN

[75] Inventors: David Feldbaumer, Chandler; Frederick L. Lum, Scottsdale; Vickie Mercier, Tempe; Mark B. Weaver; Jan-Chung Wong, both of Phoenix; Rimon Shookhtim, Mesa, all of Ariz.

[73] Assignee: Motorola, Inc., Schaumburg, Ill.

[21] Appl. No.: 330,463

[22] Filed: Oct. 28, 1994

[51] Int. Cl.⁶ .................................................. G06F 17/50
[52] U.S. Cl. ..................... 364/490; 364/488; 364/489; 364/491
[58] Field of Search .................. 364/491, 490, 364/489, 488

[56] References Cited

U.S. PATENT DOCUMENTS 5,396,435   3/1995   Ginetti ..................................... 364/489

OTHER PUBLICATIONS

"A Schematic Driven Synthesis Tool for Analog Circuits"; European ASIC; B. Goffert et Al., 1992; pp. 131–134.
"STAIC: An Interactive Framework for Synthesizing CMOS and BiCMOS Analog Circuits"; J. Harvey et al; IEEE Transactions on Computer Aided Design; vol. 11, Nov. 1992; pp. 1402–1417.
"Optimiztion–Based Placement Algorithm for BiCMOS Leaf Cell"; Hongxia Xia et al.; IEEE Journal of Solid State Circuits, vol. 29, No. 10, Oct. 1994; pp. 1227–1236.

*Primary Examiner*—Kevin J. Teska
*Assistant Examiner*—Andrew Roberts
*Attorney, Agent, or Firm*—Gary W. Hoshizaki

[57] ABSTRACT

A computer implemented method for generating an integrated circuit design (11) is provided. A description of a circuit (16) is provided in a format such as a Hardware Description Language (12). A functional simulation (17) of the description is run to determine functionality of the circuit. A netlist conversion (18) converts the description to a netlist comprising both a single-ended and differential circuit. The netlist conversion (18) converts the description to a single-ended description (24), replaces single-ended cells with differential cells and interconnects the differential cells (25), and exchanges terminals of the differential cells to maintain logic equivalence (26). A simulation with timing (19) is run on the netlist to verify timing characteristics of the circuit. The netlist is then provided to a router to generate a physical circuit layout (20) having both single-ended and differential circuits.

18 Claims, 2 Drawing Sheets

COMPUTER IMPLEMENTED METHOD FOR GENERATING AN INTEGRATED CIRCUIT DESIGN

BACKGROUND OF THE INVENTION

The present invention relates in general to computer aided integrated circuit design and, more particularly, to a computer implemented method for generating an integrated circuit design having both single-ended and differential circuits.

As integrated circuits become more dense and complex, designers have resorted to computer aided design tools to more efficiently design integrated circuits. The time required for a full scale design is drastically reduced by drawing from a library of pre-defined cells that have been fully characterized for a given wafer process flow.

One tool that is commonly used in a computer aided design system for generating an integrated circuit design is a synthesis tool. A synthesis tool receives a description of a circuit, typically in hardware description language (HDL) that functionally describes the circuit. Other description formats that describe a circuit could also be used such as a truth table, a netlist, state diagram, or an equation. The synthesis tool outputs a single-ended description of the circuit which corresponds to the actual circuit being formed on a semiconductor wafer. Synthesis tools commonly available are unable to handle differential descriptions (corresponding to differential circuitry such as CML, common mode logic) of a circuit. Synthesis tools have been designed specifically for single-ended circuitry since they make up the vast majority of digital semiconductors sold.

A netlist is a detailed interconnection of low level circuit elements, i.e. a schematic and block diagram of the circuit. The netlist is simulated to verify the proper operation and timing of the circuit. The computer aided design system will have timing information for each of the blocks or elements in the netlist. If any problem is noted during the simulation, the netlist may be updated as necessary to achieve the desired function.

Once the design is functionally correct and meets basic timing criteria, the netlist is provided to a router tool for generating an interconnected layout of the circuit. In general, gate arrays and standard cells use routers to interconnect circuit. The router performs metal interconnections and optimally places cells for the most efficient area utilization. The router also takes into account timing considerations for worst case delay paths. Actual parasitic capacitance and resistance are back-annotated from the physical layout generated by the router. The actual parasitic capacitances and resistances are fed back to the simulator and the circuit is resimulated. The updated simulation provides an accurate assessment of the circuit performance under various process and temperature conditions. This final simulation also allows changes to be made should any problems be detected. If no problems arise, masks for fabricating the circuit are generated.

Most, if not all circuit designs involve single-ended or differential logic. Single-ended logic uses 1 terminal or pin per data (logic) signal while differential logic uses 2 terminals or pins because the data signal has complimentary components. Conventional CMOS logic and TTL (Transistor Transistor Logic) are well known in the semiconductor industry as single-ended circuitry whereas Emitter Coupled Logic (ECL) is typically known as differential circuitry.

In general, prior art synthesis tools are not capable of synthesizing a differential circuit. Such tools have not yet been developed because of lack of demand from the industry. Moreover, synthesis tools cannot synthesize a combination of single-ended and differential descriptions. Again because of lack of need in the past for such tools. The dominant portion of synthesis tools for the semiconductor industry have involved single-ended synthesis.

The present trend in the electronic industry is toward low power and high speed operation. A combination of both differential and single-ended circuits may be required to meet low-power and high speed requirements simultaneously. Typical applications that demand such performance include cellular telephones, laptop computers and other portable electronics. High speed requirements encourage the use of technologies such as ECL or CML logic. To meet low power requirements, semiconductor manufacturers are reducing the operating potential of the circuits. Differential circuits can be operated at these low voltages due to their small signal swing. Furthermore, differential signals are less susceptible to noise because of the inherent common mode rejection. Single-ended circuitry can be used in sections of the circuit requiring high density and low power.

Synthesis tools for single-ended circuit design are well known in the art. However, the single-ended synthesis tools cannot synthesize differential circuits because the libraries do not support differential circuits and the single-ended synthesis tools are not set up to handle the additional information required for differential synthesis. For example, the synthesis tools are not set up to handle 2 pins per signal, nor are they set up to track important parameters for differential operation such as skew between complementary signal pairs.

Hence, a need exists for synthesis tools capable of differential synthesis and a combination of single-ended and differential synthesis.

DETAILED DESCRIPTION OF THE DRAWINGS

Figure 1:
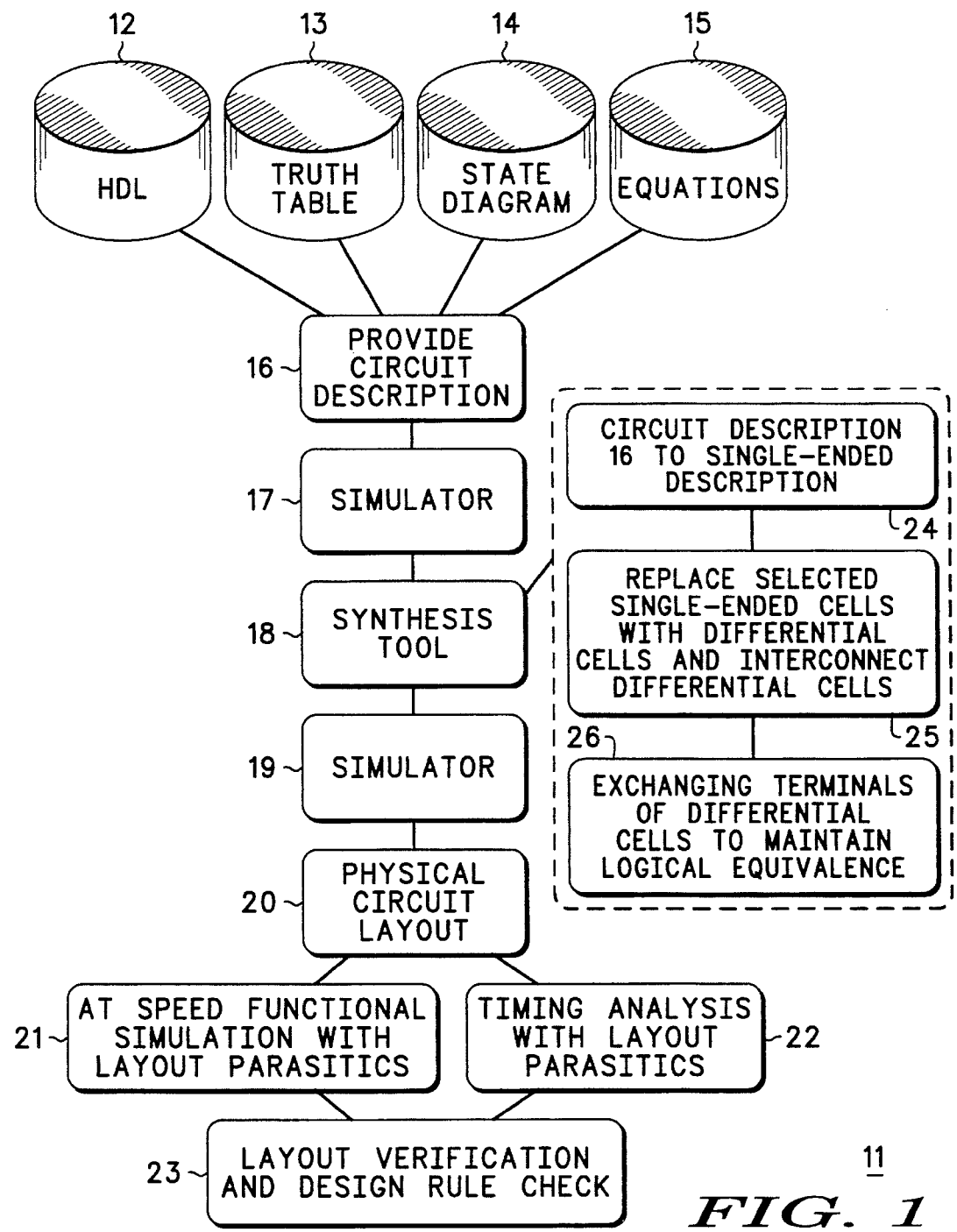
FIG. 1 flow diagram of a computer implemented integrated circuit design system.

The semiconductor industry is moving towards wafer process flows having both bipolar and CMOS devices for providing circuits of increased density and higher speeds. A wafer process flow having both bipolar and CMOS devices is commonly referred to as a BiCMOS process flow. A BiCMOS process flow allows the merging of different circuit technologies that previously were not integrated together. For example, both Emitter Coupled Logic (ECL) which is mainly a high-speed bipolar technology and standard Complementary Metal Oxide Semiconductors (CMOS) logic could be integrated on the same die using a BiCMOS process flow.

Development of Application Specific Integrated Circuit design (ASIC) methodologies has been a focus of the semiconductor industry to reduce the cycle time required to generate a complex integrated circuit design. The ASIC methodologies include gate array and standard cell approaches that are increasingly being used within the semiconductor industry. A computer implemented integrated circuit design system handles all aspects of integrated circuit design from simulation to layout. Even test vectors are automatically generated by the design system for a specific design.

A computer implemented integrated circuit design system is not limited to a library of fixed cells. Synthesis design tools have been developed to generate or synthesize a circuit. Companies such as Synopsys, Cadence, and Mentor Graphics currently offer synthesis tools that can be incorporated in an integrated circuit design system.

A synthesis tool receives a circuit description in a format such as a Hardware Description Language (HDL) from which it generates a circuit. The elements of the circuit are placed and routed (interconnected) by the computer implemented integrated design system to generate mask layers used to form integrated circuits. Synthesis tools are designed to provide a single-ended description of a circuit. This is due to the fact that the development of ASIC methodologies has focused on CMOS based technologies since they make up the vast majority of digital circuit designs. Standard CMOS gate logic falls under the category of a single-ended circuit since only a single terminal is required to receive or send a logic level. The use of synthesis tools greatly decreases the time required to generate complex circuit designs since only a higher level description is required.

The use of CMOS technology in a standard cell or gate array approach is wide spread in the semiconductor industry. However, CMOS designs are not capable of extremely high frequency performance. Bipolar technologies such as ECL and CML (Common Mode Logic) are capable of speeds significantly higher than CMOS logic. BiCMOS will allow the two types of circuits to be merged on a single semiconductor die. In general, a circuit is partitioned to use CMOS for reducing power consumption in slower running portions of the design, while ECL or other high performance circuitry is used in the remaining portion of the circuit. Translation circuits are required to interface between the two types of circuitry since CMOS circuit is single-ended and ECL is typically differential. Power can be reduced by operating the circuit-at lower voltages, for example, three volts. A problem exists in that the computer implemented integrated circuit design systems are not set up to handle differential circuits such as ECL or CML.

FIG. 1 is a diagram of a computer implemented integrated circuit design system 11 capable of generating a circuit comprising both single-ended and differential circuits. In general, digital circuits have two logic levels, a logic zero and a logic one level. The logic levels can be represented in many ways. Two main representations of a digital logic level are single-ended representation and differential representation. The single-ended representation is commonly used in CMOS and TTL logic gates. For example, a five volt CMOS process has a one logic level of five volts and a zero logic level of ground (zero volts). It is single-ended because a single line is required for providing or receiving a logic level. The differential representation is commonly used in ECL (Emitter Coupled Logic) and CML (Common Mode Logic) logic gates. The differential representation requires two lines for providing or receiving a logic level.

A circuit design is described in many different ways on a computer system. Four different formats for providing a description of a circuit are illustrated in FIG. 1. Examples of formats for describing a circuit design are Hardware Description Language (HDL) 12, truth table 13, state diagram 14 and equation 15. Other formats not described herein but capable of describing a circuit design can also be used in computer implemented integrated circuit design system 11. In the preferred embodiment, a circuit description 16 (typically in HDL) of a circuit is provided to a simulator 17 for running a functional simulation. Simulator 17 provides a first simulation of the circuit description 16 to verify functionality of the circuit design.

After proving functionality of the circuit a netlist is generated by synthesis tool 18. Synthesis tool 18 converts circuit description 16 to a single-ended description as shown in box 24. No differential descriptions exist at this point.

No further conversion is required when the circuit provided to synthesis tool 18 is single-ended. Synthesis tool 18 provides a single-ended description that is used to generate a circuit netlist that corresponds to the actual semiconductor device implementation of the circuit. A circuit netlist is a description of the interconnects of the components or cells in a circuit. A component or cell is an actual element such as a logic gate or it is a description of an element. Synthesis tools currently offered to semiconductor manufacturers provide only the capability of providing a single-ended netlist.

Further steps are required to generate a circuit description when the circuit comprises both a single-ended circuit and differential circuit. The components in the single-ended description that correspond to the differential circuit are replaced with differential descriptions as shown in box 25. The differential descriptions will have paired terminals for receiving and providing complementary signals. In the preferred embodiment, a differential circuit netlist is created that is logically equivalent to the single-ended circuit description it replaces. The differential circuit netlist is created by identifying the single-ended descriptions to be replaced by differential descriptions. The differential descriptions then replace the single-ended descriptions. The differential cells are interconnected to form the differential circuit, thus a circuit netlist is generated having both single-ended and differential circuits.

The differential circuit and the single-ended circuit do not have to be separate from one another from a functional standpoint. The circuits can be coupled together via translator circuits, a translator circuit provides a differential signal to single-ended signal conversion or a single-ended signal to differential signal conversion. In general, the translator circuits are coupled between the differential and single-ended circuits after they are formed by synthesis tool 18.

An additional step of exchanging terminals (switching terminal couplings) of a differential circuit to maintain logical equivalence is shown in box 26. Adding the step shown in box 26 allows a smaller library of components to be used in creating a differential circuit. For example, only a differential AND gate need be supported within a library instead of supporting both a differential AND gate and a differential OR gate. The OR gate is generated by applying DeMorgan's Theorem which requires exchanging interconnections on the inputs and the output of the AND gate to create an OR gate. This process is further described in FIG. 2.

The steps described in box 25 and box 26 are performed after synthesis tool 18 has generated a single-ended description of the circuit. Box 25 and Box 26 could also be incorporated into synthesis tool 18 wherein synthesis tool 18 provides a circuit netlist comprising a single-ended circuit and a differential circuit.

The circuit netlist of the circuit is provided to simulator 19 for simulation. Simulator 19 includes timing parameters for simulating the circuit with component delays. Simulator 19 provides a first pass simulation of the circuit at operating speed for identifying marginal delay paths over various voltage and temperature conditions.

A physical circuit layout 20 is performed by a routing tool after simulation verifies the circuit at-speed performance. The router places and interconnects the components which form the circuit in either a gate array or a standard cell approach. The physical circuit layout 20 represents the circuit as it would be formed on a semiconductor wafer.

An at-speed functional simulation with layout parasitics 21 is run to verify performance of the circuit under different operating conditions. Actual capacitance and resistance values are back-annotated from physical circuit layout 20 for providing a very accurate simulation of the circuit.

A timing analysis with layout parasitics 22 is run to check delay paths within the circuit. Another common name for this simulation is a Static Timing Analysis. The back-annotated capacitance and resistance values are included to accurately simulate each path.

A layout verification and design rule check 23 is a final step before masks are generated for fabricating the circuit. Layout verification verifies that the layout matches the circuit netlist. Design rule checking checks the layout to insure that no process layout rules are violated.

Figure 2:
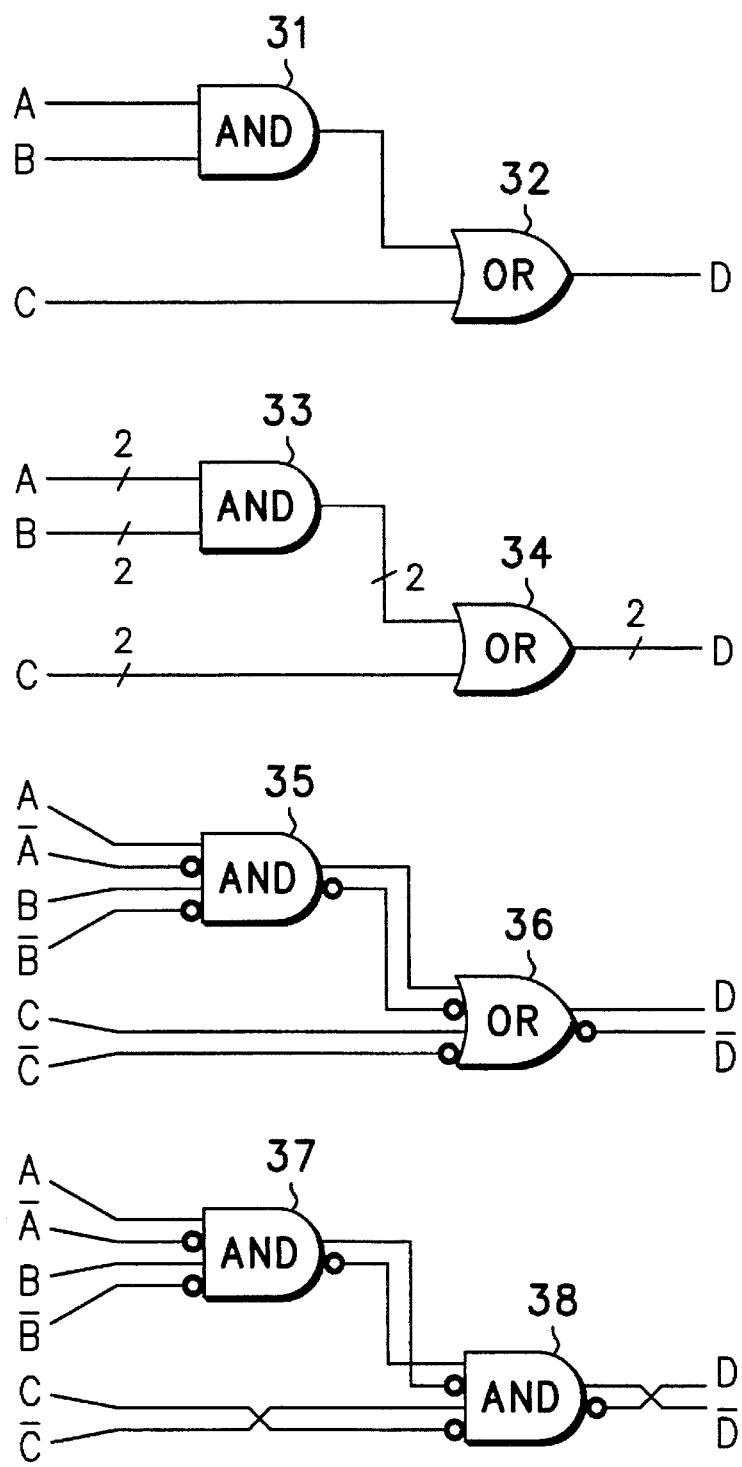
FIG. 2 is a diagram illustrating the conversion of a single-ended description to an optimized differential description.

FIG. 2 is a diagram illustrating the conversion of a single-ended description to an optimized differential description. An example of a single-ended description is shown in a schematic of AND gate 31 and OR gate 32. In the preferred embodiment a synthesis tool creates the single-ended description. The single-ended description functionally represents the actual circuit implemented on a silicon wafer. AND gate 31 has a first input coupled for receiving an input A, a second input for receiving an input B, and an output. OR gate 32 has a first input coupled to the output of AND gate 31, a second input coupled for receiving an input C, and an output for providing an output D. The schematic of AND gate 31 and OR gate 32 is a graphical representation of a netlist. A netlist is a description of the interconnects of the components in a circuit. A component is an actual element that can be implemented on a semiconductor wafer such as a logic gate or the component can be a description of the actual element that functionally describes the component operation such as a data structure.

To create a differential circuit from the single-ended circuit described hereinabove, AND gate 31 and OR gate 32 are respectively replaced with a differential description of an AND gate 33 and an OR gate 34. A first step is to identify which components or cells are differential cells in the single-ended description (in this case all components are converted to differential). A second step is to replace the identified components with corresponding differential cells. A third step is to interconnect the differential cells to form a differential circuit logically equivalent to the single-ended components it replaces. In the preferred embodiment, the differential interconnections required by differential circuits are modeled as busses. Each bus comprises two interconnects for a terminal and a complementary terminal. In general, computer aided integrated circuit design tools handle multiple connections to a circuit or cell with a bus. Using a bus simplifies representation of differential interconnections and the manipulations of those interconnections within the computer aided design tool.

AND gate 35 and OR gate 36 illustrate differential terminals associated with a differential description. AND gate 35 and OR gate 36 correspond respectively to AND gate 33 and OR gate 34. AND gate 35 has a first input for receiving an A input, a second input for receiving a complemented A input, a third input for receiving a B input, a fourth input for receiving a complemented B input, a first output for providing an output, and a second output for providing a complemented output. OR gate 36 includes a first input coupled to the first output of AND gate 35f a second input coupled to the second output of AND gate 35, a third input coupled for receiving a C input, a fourth input coupled for receiving a complemented C input, a first output for providing a D output, and a second output for providing a complemented D output. It should be noted that the differential description of AND gate 35 and OR gate 36 is logically equivalent to the single-ended description of AND gate 31 and OR gate 32.

One method for increasing the efficiency of the conversion from a single-ended to differential description and greatly simplifying the cell library required is to reduce the number of component types or descriptions required to model circuits. An example of a logically equivalent circuit to the single-ended description of AND gate 31 and OR gate 32 is the differential description of AND gates 37 and 38. Notice that only a single component type is required to generate a logically equivalent circuit. The AND gate is made logically equivalent to an OR gate by exchanging the input terminals and the output terminals of each signal and its complement. This applies the rule known as DeMorgan's theorem of Boolean algebra. AND gate 37 has a first input for receiving an A input, a second input for receiving a complemented A input, a third input for receiving a B input, a fourth input for receiving a complemented B input, a first output for providing an output, and a second output for providing a complemented output. AND gate 38 includes a first input coupled to the second output of AND gate 35, a second input coupled to the first output of AND gate 35, a third input coupled for receiving a complemented C input, a fourth input coupled for receiving a C input, a first output for providing a complemented D output, and a second output for providing a D output. The technique of exchanging terminals can be applied to a number of differential cells to reduce the number of differentials cell types required to generate logically equivalent circuits.

By now it should be appreciated that a computer implemented method for generating an integrated circuit design has been provided that generates a circuit comprising both single-ended and differential circuits.

A description of a circuit comprising interconnected single-ended cells is provided. Some of the single-ended cells of the circuit are selected and replaced with differential cells. The differential cells have differential terminals for receiving and providing complementary signals. The differential terminals of the differential cells are coupled to form a differential circuit. Remaining single-end cells of the circuit form a single-ended circuit.

A description of a circuit is provided. The description is converted into a netlist of interconnected single-ended cells. Some of the single-ended cells of the netlist are converted to differential cells. The differential cells are provided from a library of differential cells. The differential cells have differential terminals for providing and receiving complementary signals. The differential cells are coupled to form a differential circuit. The differential circuit is logically equivalent to the single-ended circuit it replaces.

A netlist is provided comprising interconnected single-ended cells. The interconnected single-ended cells form a circuit. The interconnections between the single-ended cells are identified. Some of the single-ended cells are selected and converted to differential cells. The interconnections of the differential cells are changed to busses to simplify manipulation of the complementary terminals of each differential cell.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A computer implemented method for generating an integrated circuit design from a description, the description comprising a plurality of single-ended cells coupled together to form a circuit, the method comprising the steps of:

identifying single-ended cells of the circuit to be changed to full differential cells;

replacing some of the identified single-ended cells with corresponding equivalent differential cells;

converting remaining single-ended cells of the identified single-ended cells with logically equivalent differential cells generated via DeMorgans theorem; and coupling differential terminals of said equivalent differential cells and said logically equivalent differential to form a differential circuit, said differential circuit being functionally equivalent to the identified single-ended cells of the circuit, the remaining single-ended cells form a single-ended circuit.

2. The method as recited in claim 1 wherein prior to the step of identifying single-ended cells of the circuit to be changed to full differential cells there is a step of simulating the circuit for checking the circuit functionality.

3. The method as recited in claim 1 wherein said step of converting converting remaining single-ended cells of the identified single-ended cell includes the steps of:

replacing remaining single-ended cells of the identified single-ended cells with differential cells; and exchanging connections of differential terminals of said differential cells to maintain logic equivalence to said remaining single-ended cells of the identified single-ended cells.

4. The method as recited in claim 1 further including a step of simulating said single-ended circuit and said differential circuit for checking timing and functionality.

5. The method as recited in claim 4 further including a step of generating a physical layout of the circuit.

6. The method as recited in claim 5 further including a step of simulating the circuit with back-annotated parasitic capacitance and resistance from said physical layout.

7. The method as recited in claim 6 further including a step of simulating propagation delays within the circuit with back-annotated parasitic capacitance and resistance from said physical layout.

8. The method as recited in claim 7 further including a step of verifying said physical layout conforms to layout design rules and said physical layout matches the circuit.

9. A method for computer generating an integrated circuit design comprising the steps of:

providing a single-ended cells library;

generating equivalent differential cells of some single-ended cells of said single-ended cells library;

generating logically equivalent differential cells using DeMorgans theorem for remaining single-ended cells of said single-ended cells library; and combining equivalent differential cells and logically equivalent differential cells to form a differential cells library functionally equivalent to said single-ended cells library.

10. The method as recited in claim 9 further including the steps of:

providing a description of a circuit;

converting said description of said circuit to a netlist of interconnected single-ended cells from said single-ended cells library;

identifying single-ended cells of said circuit to be changed to full differential cells;

replacing the identified single-ended cells of said circuit with equivalent differential cells and logically equivalent differential cells; and coupling differential terminals of the replaced single-ended cells with equivalent differential cells and logically equivalent differential cells to form a differential circuit wherein said differential circuit is functionally equivalent to the identified single-ended cells of the circuit.

11. The method as recited in claim 10 wherein said step of providing a description of a circuit includes a step of providing a description of a circuit in truth table or equation format.

12. The method as recited in claim 10 wherein said step of providing a description of a circuit includes a step of providing a description of a circuit in a state diagram.

13. The method as recited in claim 10 wherein said step of converting said description of said circuit to a netlist of interconnected single-ended cells further includes a step of converting said description of said circuit with a circuit synthesis tool for generating said netlist of interconnected single-ended cells.

14. The method as recited in claim 10 wherein said step of providing a description of a circuit includes a step of providing a description of a circuit in a hardware description language.

15. A method for computer generating an integrated circuit comprising the steps of:

providing a single-ended cells library;

providing a netlist, said netlist comprising a plurality of single-ended cells from said single-ended cell library interconnected to form a circuit;

identifying interconnections between said plurality of single-ended cells;

converting select ones of said plurality of single-ended cells to differential cells; and changing interconnections of said differential cells to busses.

16. The method as recited in claim 15 wherein said step of converting select ones of said plurality of single-ended cells to differential cells includes the steps of:

generating equivalent differential cells of some single-ended cells of said single-ended cells library;

generating logically equivalent differential cells using DeMorgans theorem for remaining single-ended cells of said single-ended cells library: and combining equivalent differential cells and logically equivalent differential cells to form a differential cells library functionally equivalent to said single-ended cells library; and exchanging said select ones of said plurality of single-ended cells to differential cells from said differential cells library.

17. The method as recited in claim 16 wherein said step of changing interconnections of said differential cells to busses includes a step exchanging bus interconnections of said differential base cells for providing a logic equivalent of said select ones of said plurality of single-ended cells.

18. The method as recited in claim 17 wherein said step of changing interconnections of said differential cells to busses includes a step of changing interconnection of said differential cells to busses having two lines.

* * * * *